(12) United States Patent
Singh et al.

(10) Patent No.: US 9,508,743 B2
(45) Date of Patent: Nov. 29, 2016

(54) DUAL THREE-DIMENSIONAL AND RF SEMICONDUCTOR DEVICES USING LOCAL SOI

(71) Applicant: GLOBALFOUNDRIES Inc., Grand Cayman (KY)

(72) Inventors: Jagar Singh, Clifton Park, NY (US); Srikanth Balaji Samavedam, Cohoes, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/525,842

(22) Filed: Oct. 28, 2014

(65) Prior Publication Data

US 2016/0118414 A1 Apr. 28, 2016

(51) Int. Cl.
| | |
|---|---|
| *H01L 27/12* | (2006.01) |
| *H01L 21/84* | (2006.01) |
| *H01L 29/06* | (2006.01) |
| *H01L 23/66* | (2006.01) |
| *H01L 21/762* | (2006.01) |
| *H01L 27/092* | (2006.01) |

(52) U.S. Cl.
CPC ....... *H01L 27/1211* (2013.01); *H01L 21/7624* (2013.01); *H01L 21/845* (2013.01); *H01L 23/66* (2013.01); *H01L 27/092* (2013.01); *H01L 27/1207* (2013.01)

(58) Field of Classification Search
CPC . H01L 27/1211; H01L 29/785; H01L 21/845
USPC ........................................................ 438/164
See application file for complete search history.

(56) References Cited

U.S. PATENT DOCUMENTS

| | | | |
|---|---|---|---|
| 8,697,536 B1* | 4/2014 | Cheng | H01L 29/16 438/424 |
| 9,082,852 B1* | 7/2015 | Liu | H01L 29/785 438/164 |
| 2009/0057846 A1* | 3/2009 | Doyle | H01L 27/0886 257/623 |
| 2011/0068414 A1* | 3/2011 | Anderson | H01L 29/66795 257/401 |

(Continued)

OTHER PUBLICATIONS

Sungjae Lee, et al., "Record RF Performance of 45-nm SOI CMOS Technology," IBM Systems and Technology Group, IEEE, 1-4244-0439-X/07, pp. 255-258.

(Continued)

*Primary Examiner* — Moazzam Hossain
(74) *Attorney, Agent, or Firm* — Wayne F. Reinke, Esq.; Heslin Rothenberg Farley & Mesiti P.C.

(57) ABSTRACT

Co-fabrication of a radio-frequency (RF) semiconductor device with a three-dimensional semiconductor device includes providing a starting three-dimensional semiconductor structure, the starting structure including a bulk silicon semiconductor substrate, raised semiconductor structure(s) coupled to the substrate and surrounded by a layer of isolation material. Span(s) of the layer of isolation material between adjacent raised structures are recessed, and a layer of epitaxial semiconductor material is created over the recessed span(s) of isolation material over which another layer of isolation material is created. The RF device(s) are fabricated on the layer of isolation material above the epitaxial material, which creates a local silicon-on-insulator, while the three-dimensional semiconductor device(s) can be fabricated on the raised structure(s).

12 Claims, 11 Drawing Sheets

(56) References Cited

U.S. PATENT DOCUMENTS

| | | | |
|---|---|---|---|
| 2014/0158976 A1* | 6/2014 | Dasgupta | H01L 29/0684 257/12 |
| 2014/0308781 A1* | 10/2014 | Basker | H01L 21/845 438/154 |
| 2015/0097220 A1* | 4/2015 | Ponoth | H01L 27/0629 257/296 |
| 2015/0206796 A1* | 7/2015 | Dasgupta | H01L 21/02381 257/76 |
| 2015/0228668 A1* | 8/2015 | Ponoth | H01L 21/76224 257/350 |
| 2015/0249127 A1* | 9/2015 | Xie | H01L 29/0692 438/437 |

OTHER PUBLICATIONS

J.C. Tinoco, et al., "Impact of Extrinsic Capacitances on FinFETs RF Performance," Microwave Theory and Techniques, IEEE Transactions on (vol. 61, Issue: 2) 2013, pp. 73-76.

Sang Lam, et al., "Design of Wide MOSFETs on Re-crystallized Polysilicon Film with Multigigahertz Cuf-off Frequency," Solid-State Device Research Conference, 2001 (4 pages).

* cited by examiner

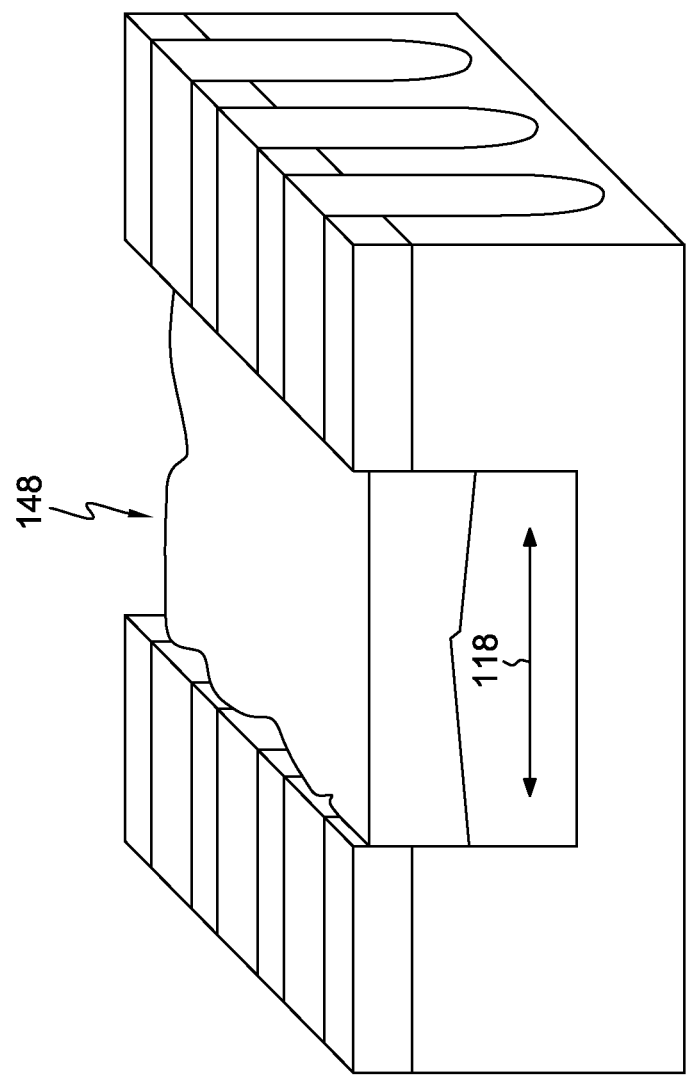

DUAL THREE-DIMENSIONAL AND RF SEMICONDUCTOR DEVICES USING LOCAL SOI

BACKGROUND OF THE INVENTION

1. Technical Field

The present invention generally relates to the common fabrication of three-dimensional semiconductor devices and Radio-Frequency (RF) semiconductor devices. More particularly, the present invention relates to such common fabrication via local Silicon-on-Insulator (SOI) for the RF devices.

2. Background Information

Currently, the parasitic resistance/capacitance of three-dimensional transistors (e.g., FinFETs) is considered too high for many Radio-Frequency (RF) applications, as compared to planar bulk MOSFETs. In addition, current FinFET technology has focused largely on optimization for logic functions. Silicon-on-Insulator (SOI) type CMOS technology, having comparatively lower parasitic resistance/capacitance, shows better RF performance than bulk CMOS. Thus, at present, SOI would appear to be the best technology for RF applications.

Therefore, a need exists to cost-effectively co-fabricate RF semiconductor devices with three-dimensional semiconductor devices while reducing the parasitic resistance/capacitance of the three-dimensional devices.

SUMMARY OF THE INVENTION

The shortcomings of the prior art are overcome and additional advantages are provided through the provision, in one aspect, of a method of co-fabricating a local SOI radio-frequency semiconductor device with a non-planar device architecture. The method includes providing a starting three-dimensional semiconductor structure, the starting structure including a bulk semiconductor substrate, a plurality of raised semiconductor structures coupled to the substrate and surrounded by a layer of isolation material. The method further includes recessing at least one span of the layer of isolation material between adjacent raised structures, creating a layer of epitaxial semiconductor material over the recessed at least one span of isolation material, creating another layer of isolation material over the layer of epitaxial material, and fabricating one or more radio-frequency (RF) devices on the another layer of isolation material.

In accordance with another aspect, a three-dimensional semiconductor structure is provided. The structure includes a semiconductor substrate, a plurality of raised semiconductor structures coupled to the substrate, a layer of isolation material surrounding the plurality of raised structures, at least one region of epitaxial semiconductor material over a recessed span of the layer of isolation material between adjacent raised structures, another layer of the isolation material over the at least one region of epitaxial semiconductor material, and at least one radio-frequency (RF) semiconductor device on each of the another layer of isolation material.

These, and other objects, features and advantages of this invention will become apparent from the following detailed description of the various aspects of the invention taken in conjunction with the accompanying drawings.

BRIEF DESCRIPTION OF THE DRAWINGS

FIG. 8 depicts one example of the three-dimensional structure of FIG. 7 with epitaxial silicon structures grown and merged on the recessed span of isolation material, in accordance with one or more aspects of the present invention.

DETAILED DESCRIPTION OF THE INVENTION

Figure 1:
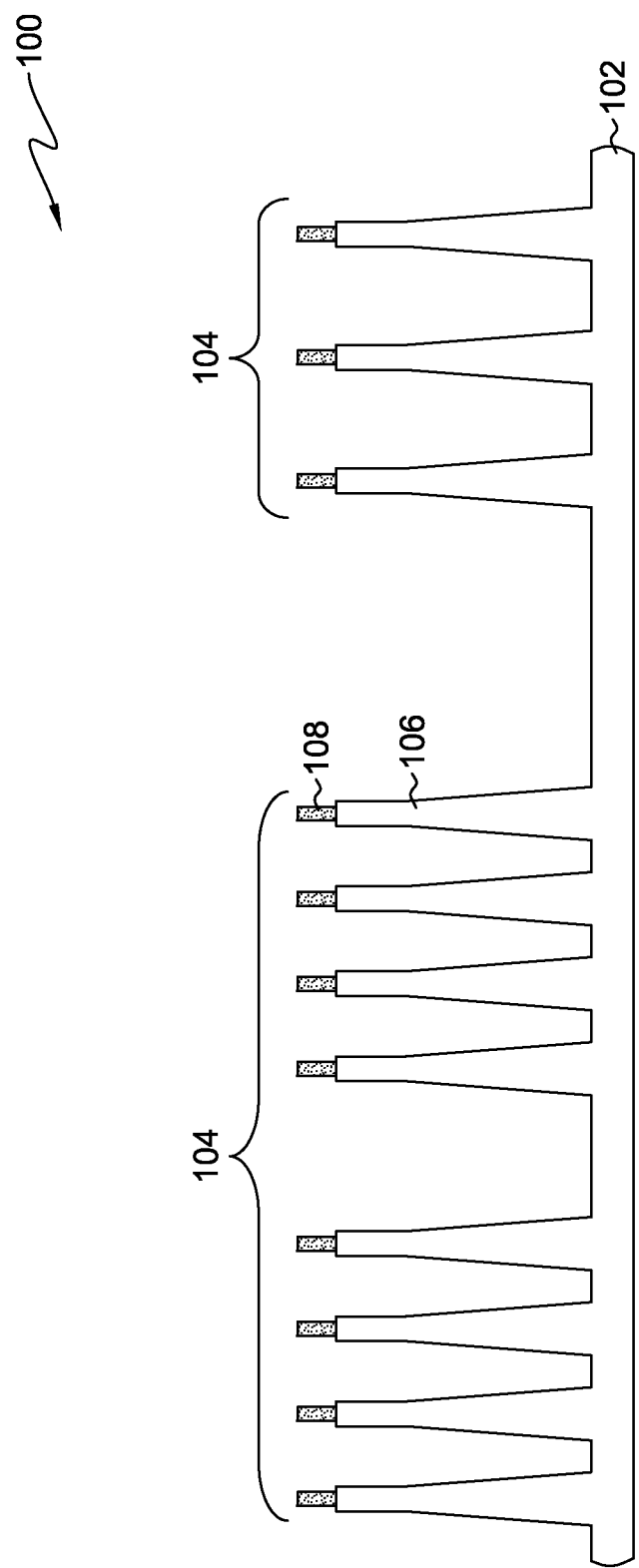
FIG. 1 is a cross-sectional view of one example of a starting three-dimensional semiconductor structure, the structure including a bulk semiconductor substrate (e.g., bulk silicon), and a plurality of raised semiconductor structures coupled to the substrate, each raised structure including a layer of hard mask material thereover, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting three-dimensional semiconductor structure 100, the structure including a bulk semiconductor substrate 102 (e.g., bulk silicon), and a plurality of raised semiconductor structures 104, each raised structure (e.g., raised structure 106) including a layer 108 of hard mask material (e.g., silicon nitride) thereover, in accordance with one or more aspects of the present invention.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structures 104 may each take the form of a "fin." The raised structure(s) may be patterned and etched from the bulk substrate, and may include, for example, any of the materials listed above with respect to the substrate. Further, some or all of the raised structure(s) may include added impurities (e.g., by doping), making them n-type or p-type.

Figure 2:
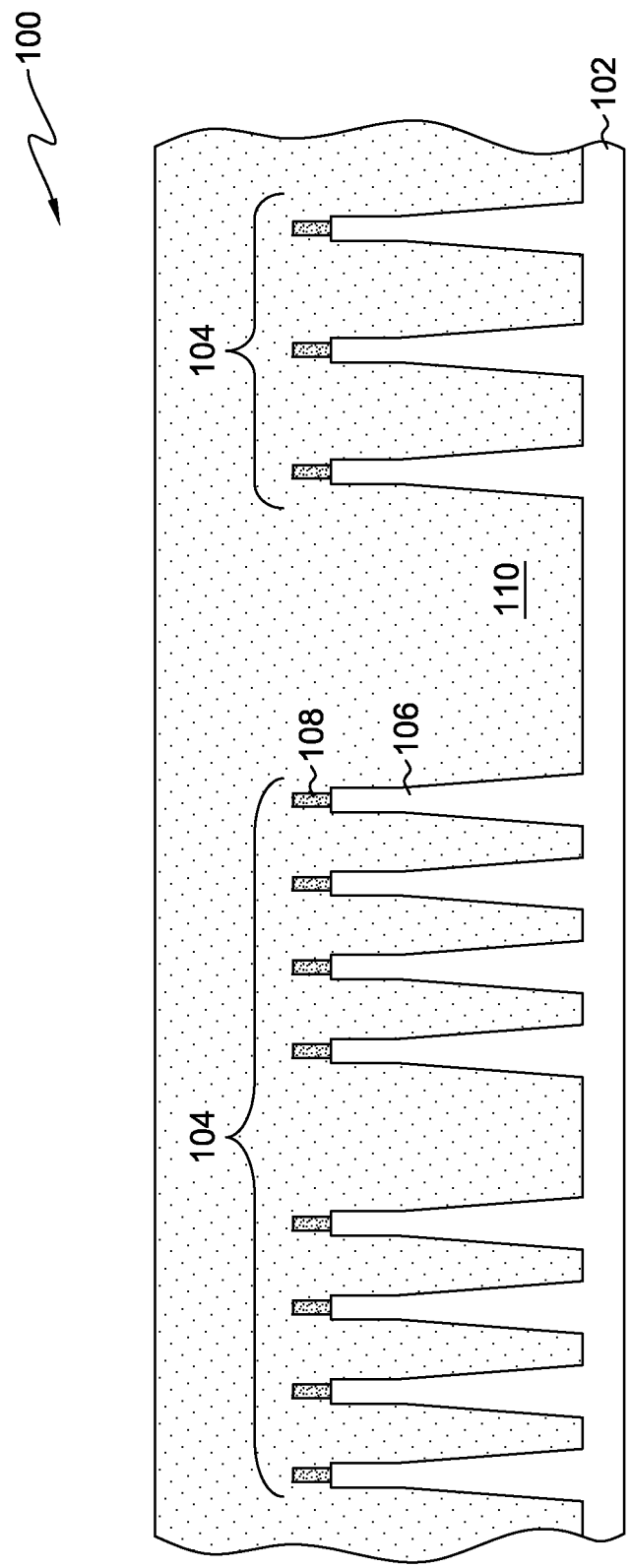
FIG. 2 depicts one example of the three-dimensional structure of FIG. 1 after creation of a blanket conformal layer of isolation material thereover (e.g., STI (shallow trench isolation) material), in accordance with one or more aspects of the present invention.

FIG. 2 depicts one example of the three-dimensional structure of FIG. 1 after creation of a blanket conformal layer 110 of isolation material thereover (e.g., shallow trench isolation (STI) material), in accordance with one or more aspects of the present invention.

In one example, the isolation material may be, for example, an oxide (e.g., silicon dioxide), and may be created, for example, using conventional deposition techniques and processes.

Figure 3:
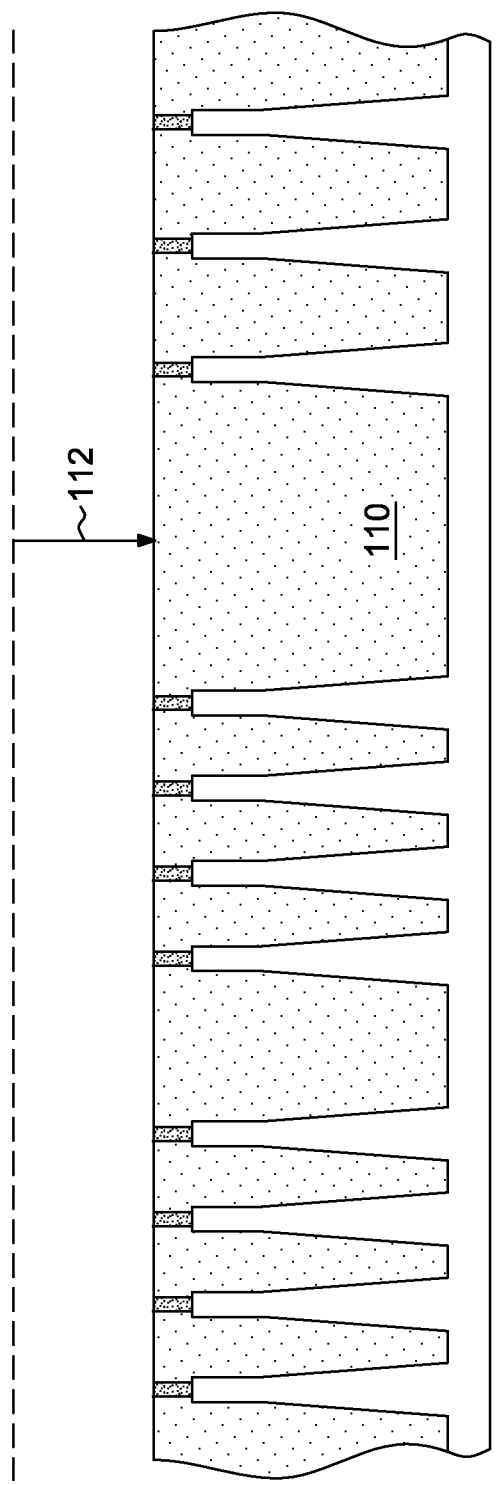
FIG. 3 depicts one example of the three-dimensional structure of FIG. 2 after recessing the blanket conformal layer of isolation material using the layer of hard mask material as a stop, in accordance with one or more aspects of the present invention.

FIG. 3 depicts one example of the three-dimensional structure of FIG. 2 after recessing 112 the blanket conformal layer 110 of isolation material using the layer 108 of hard mask material as a stop, in accordance with one or more aspects of the present invention.

In one example, the blanket conformal layer of isolation material may be recessed, for example, using one or more chemical-mechanical polishes (CMP) (e.g., a relatively fast CMP, followed by a relatively slow CMP, in order to stop on the hard mask material).

Figure 4:
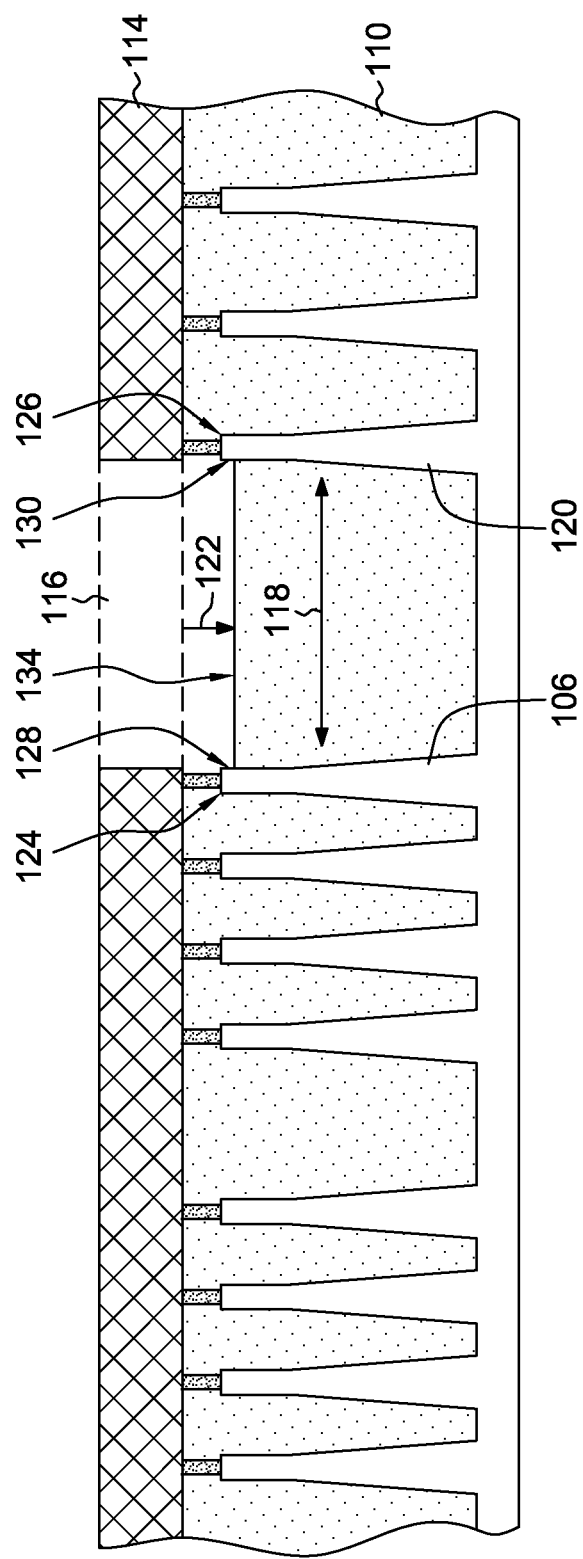
FIG. 4 depicts one example of the three-dimensional structure of FIG. 3 after creating a second layer of hard mask material (e.g., silicon nitride) over the structure, a portion thereof being open above a span of isolation material separating one or more types of three-dimensional semiconductor devices in fabrication from one or more three-dimensional radio-frequency devices in fabrication, the span of isolation material recessed below a top surface of the adjacent raised semiconductor structures, exposing a portion of the raised structures, in accordance with one or more aspects of the present invention.

FIG. 4 depicts one example of the three-dimensional structure of FIG. 3 after creating a second layer of hard mask material 114 over the structure with an open area 116 therein above a span 118 of isolation material between adjacent raised structures 106 and 120, the span of isolation material being recessed 122 below a top surface (124 and 126) of the adjacent raised semiconductor structures, exposing a portion (128 and 130) of the raised structures, in accordance with one or more aspects of the present invention.

In one example, the second layer 114 of hard mask material may be created, for example, by first creating a blanket layer of hard mask material (e.g., silicon nitride), which may have a thickness of, for example, about 2 nm to about 100 nm, and may be created, for example, using conventional deposition techniques and processes, such as, for example, CVD (chemical vapor disposition). Removal of a portion of the blanket layer of hard mask material, resulting in open area 116, may be accomplished, for example, using conventional etch techniques and processes that minimize removal of the isolation material 110. Recessing 122 the span of isolation material may be accomplished, for example, using conventional etch techniques and processes that do not affect the hard mask material over each raised structure or the raised structures themselves.

Figure 5:
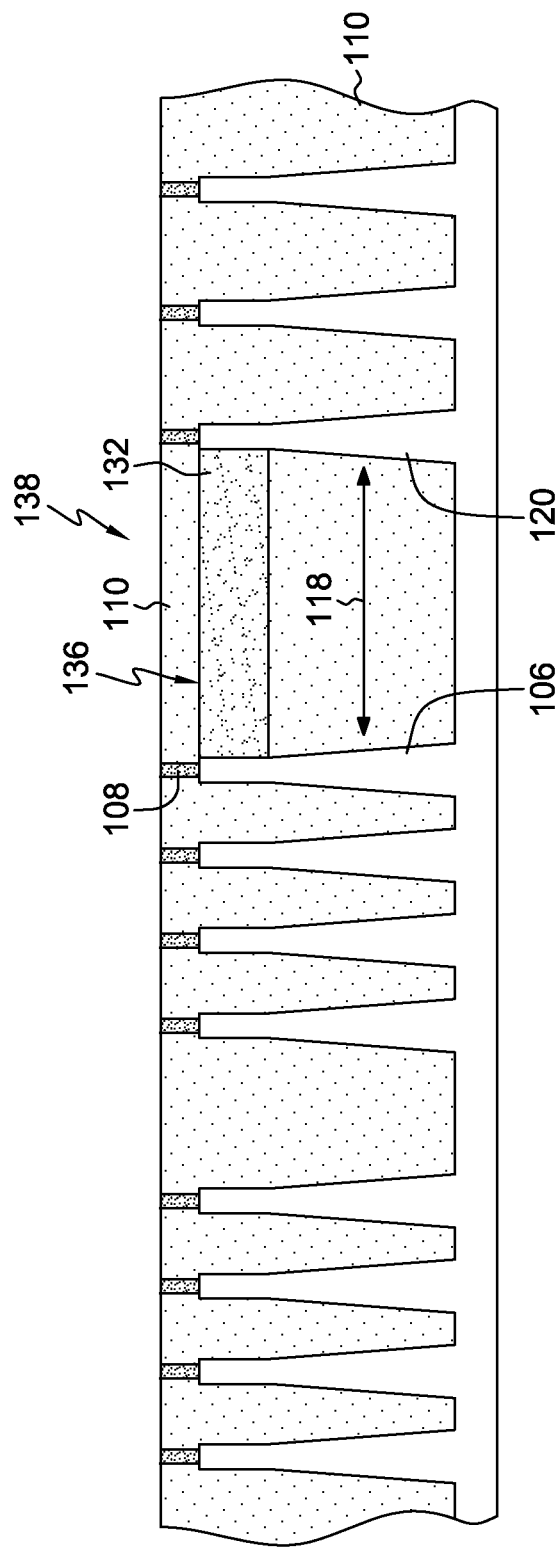
FIG. 5 depicts one example of the three-dimensional structure of FIG. 4 after growing epitaxial material on a top surface of the recessed span of isolation material, using the exposed portion (e.g., silicon) of the adjacent raised structures to seed the epitaxial material (e.g., silicon-based epitaxial material), planarizing the epitaxial material, filling an opening above the planarized epitaxial material with the isolation material, and removing the remaining layer of second hard mask material using the hard mask material on the raised structures as a stop, in accordance with one or more aspects of the present invention.

FIG. 5 depicts one example of the three-dimensional structure of FIG. 4 after creating (e.g., growing) epitaxial material 132 on a top surface (134, FIG. 4) of the recessed span 118 of isolation material 110, using the exposed portion (128, 130 FIG. 4) of the adjacent raised structures (106 and 120) to seed the epitaxial material, planarizing the epitaxy to create a uniform top surface 136, filling an opening 138 above the planarized epitaxy with the isolation material 110, and removing the remaining layer (114, FIG. 4) of second hard mask material using the hard mask material 108 on the raised structures 104 as a stop, in accordance with one or more aspects of the present invention.

In one example, the epitaxial material 132 may include epitaxial silicon, and may be conventionally created, for example, by growing epitaxial silicon structures and allowing to merge, resulting in a relatively uniform structure, and using the exposed portion (128 and 130) of the adjacent raised structures (106 and 120, respectively) to seed the growth. In one example, an initial seed is used to help grow the epitaxial material with similar orientation, e.g., silicon with an orientation of <100>, the exposed portions of the raised structures allowing epitaxial silicon to grow in the same preferential orientation, since it offers the lowest state of energy. The exposed portions can be limited, based upon the choice of growth material and its preferred orientation. The epitaxial material may then be planarized (e.g., using chemical-mechanical polishing) to create a uniform top surface 136, creating an opening 138 thereabove, which may then be filled with the isolation material 110. Removal of the remaining layer 114 of second hard mask material may be accomplished, for example, using chemical-mechanical polishing, stopping on the hard mask material 108 on the raised structures.

Figure 6:
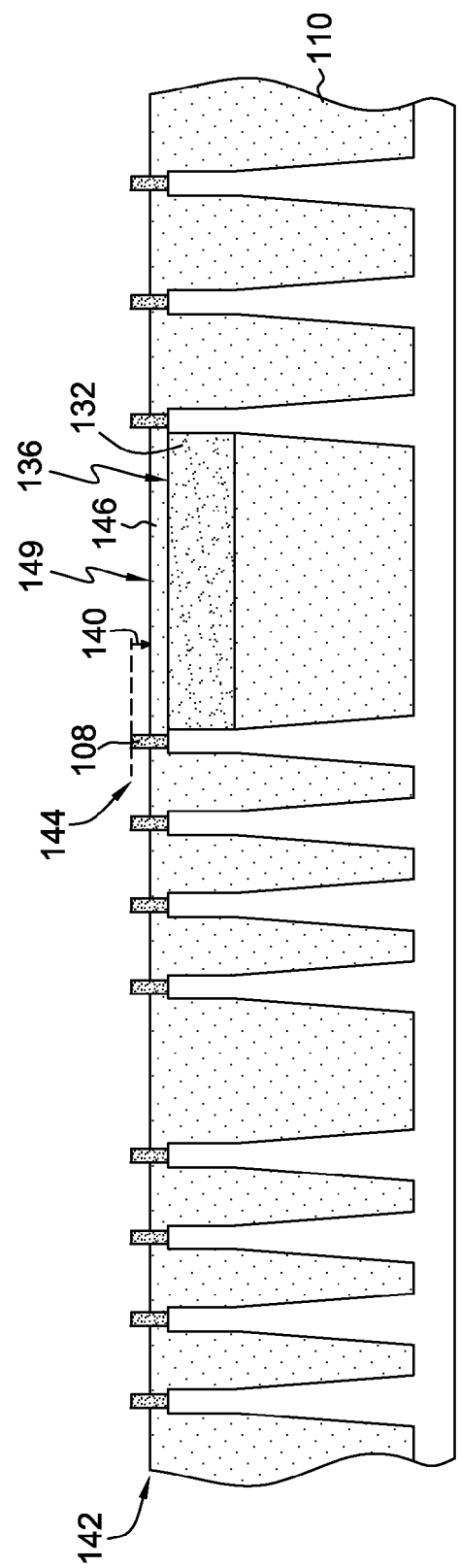
FIG. 6 depicts one example of the three-dimensional structure of FIG. 5 after recessing the isolation material to a height below a top surface of the hard mask material on the raised structures and above the epitaxial material, leaving a layer of the isolation material over the epitaxy, in accordance with one or more aspects of the present invention.

FIG. 6 depicts one example of the three-dimensional structure of FIG. 5 after recessing 140 the isolation material 110 to a height 142 below a top surface 144 of the hard mask material 108 on the raised structures and above the top surface 136 of the epitaxial material 132, leaving a relatively thin layer 146 of the isolation material over the epitaxial material, in accordance with one or more aspects of the present invention.

Recessing the layer 110 of isolation material may be accomplished, for example, using conventional techniques and processes (e.g., a deglaze process).

Figure 7:
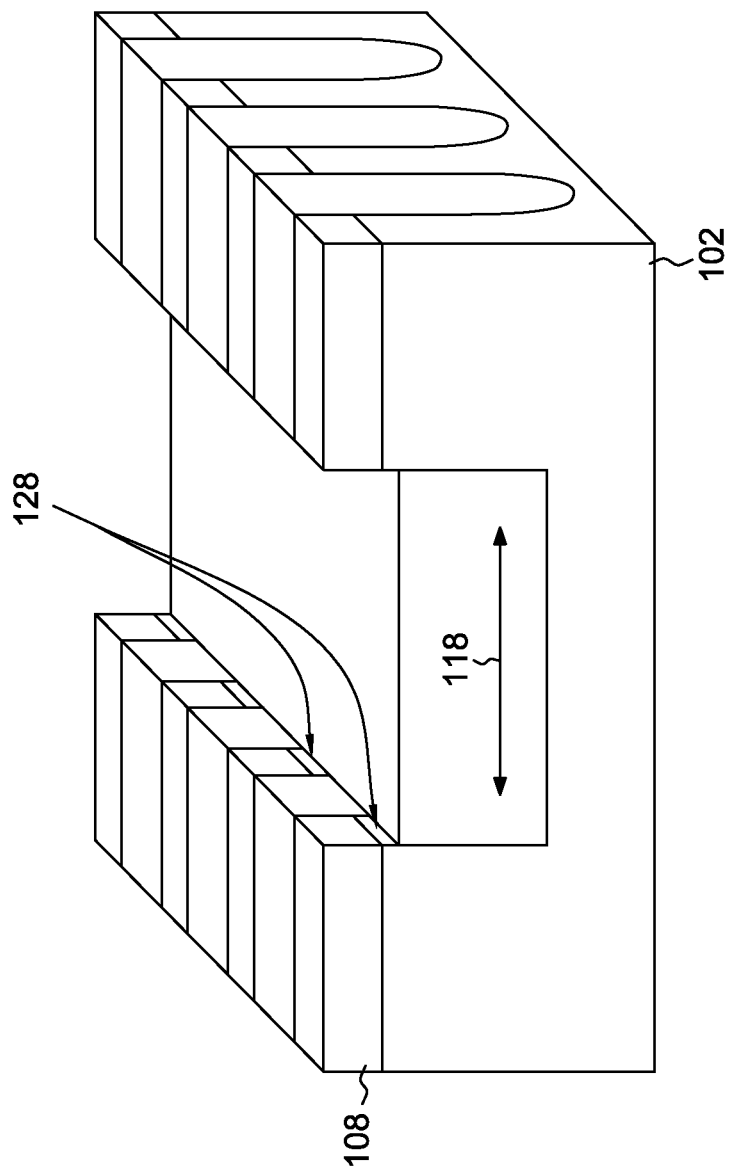
FIG. 7 depicts one example of a perspective (three-dimensional) view of FIG. 4, in accordance with one or more aspects of the present invention.

FIG. 7 depicts one example of a perspective (three-dimensional) view of a portion of the structure of FIG. 4 to better show span 118 and the exposed portions (e.g., portion 128), in accordance with one or more aspects of the present invention.

FIG. 8 depicts one example of the three-dimensional structure of FIG. 7 with epitaxial silicon structures 148 grown and merged on the recessed span 118 of isolation material.

Figure 11:
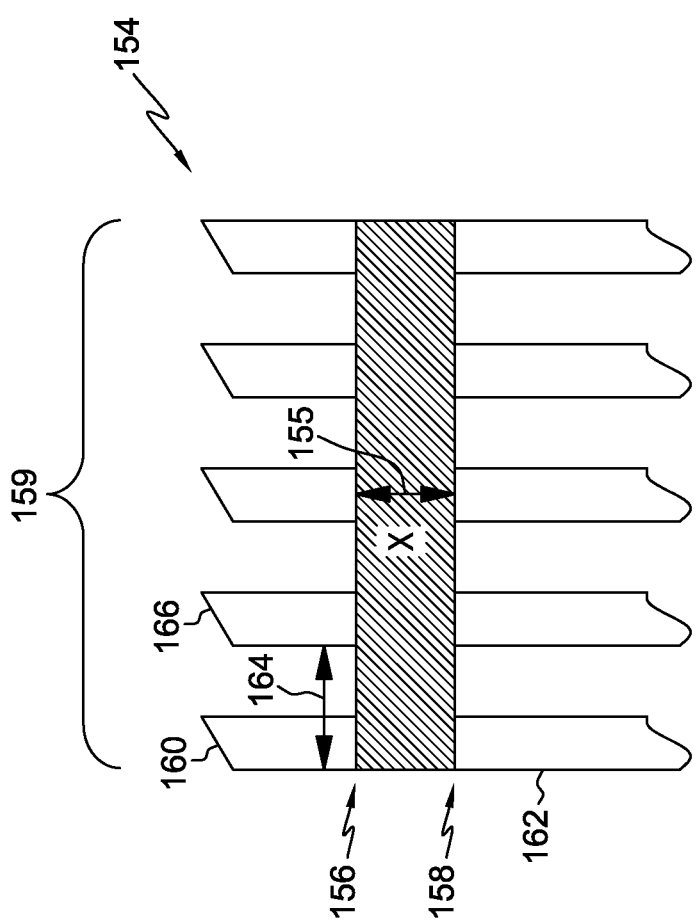

FIG. 11 shows the layout 154 of raised structures prior to epitaxial material growth. A distance 155 between tips of raised structures (e.g., tips 156 and 158 of raised structures 160 and 162, respectively) is controlled by the width of isolation material (e.g., shallow trench isolation (STI)), which may be less than the pitch 164 of the raised structures (i.e., the distance between adjacent raised structures), for example, between raised structures 160 and 166. The pitch may be, for example, about 54 nm, about 48 nm, about 42 nm or about 32 nm.

Figure 12:
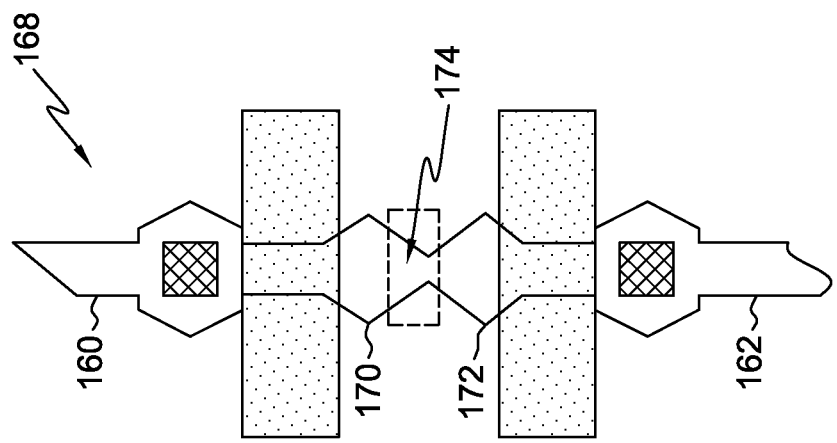
FIGS. 11 and 12 are top-down views of one example of before and after structures of the merging epitaxy via tip-to-tip raised structure epitaxial growth and merge, in accordance with one or more aspects of the present invention.

FIG. 12 depicts one example of a portion 168 of the structure of FIG. 11 after tip-to-tip epitaxial growth and merger, for example, epitaxial structures 170 and 172 on raised structures 160 and 162, respectively, merged 174 at their tips, in accordance with one or more aspects of the present invention.

In other examples, the epitaxial growth and merger could be done without a mask via side-to-side merger or a combination of tip-to-tip and side-to-side merger using a group of raised structures.

Where, for example, FinFETs are co-fabricated with RF devices, options for the timing of the epitaxial material growth and merger include doing so after source and drain epitaxy formation. Another option is growth and merger during source and drain epitaxy formation. In particular, in one example, the source and drain epitaxial growth can be extended over the adjacent isolation material.

Figure 9:
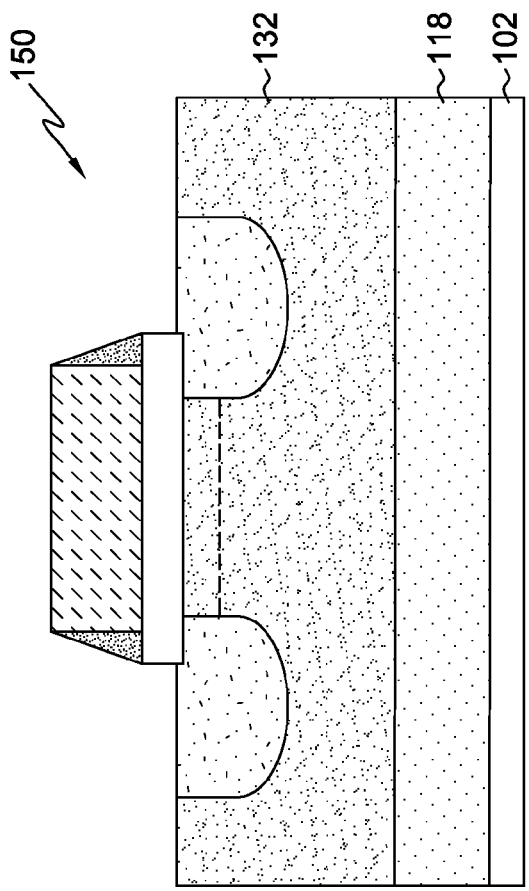
FIG. 9 is a cross-sectional view of one example of a RF device fabricated on the layer of isolation material above the epitaxial material, in accordance with one or more aspects of the present invention.

FIG. 9 is a cross-sectional view of one example of a RF device 150 fabricated on the layer 110 of isolation material above the epitaxial material 132, in accordance with one or more aspects of the present invention.

Figure 10:
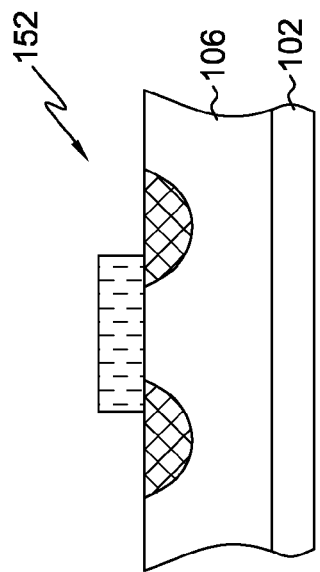
FIG. 10 is a cross-sectional view of one example of a three-dimensional semiconductor device (a three-dimensional transistor in this example) fabricated on one or more of the raised structures of FIG. 6, in accordance with one or more aspects of the present invention.

FIG. 10 is a cross-sectional view of one example of a three-dimensional semiconductor device 152 (a three-dimensional transistor in this example) fabricated on one or more of the raised structures of FIG. 6 (e.g., raised structure 106), in accordance with one or more aspects of the present invention.

FIGS. 11 and 12 are top-down views of one example of before and after structures of the merging epitaxy via tip-to-tip raised structure epitaxial growth and merge, in accordance with one or more aspects of the present invention.

Figure 14:
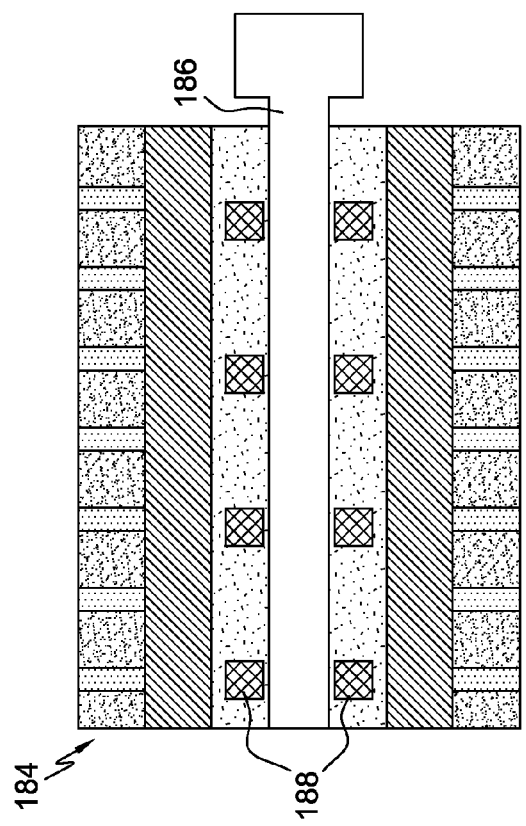
FIG. 14 is a top-down view of another example of a layout design for co-fabricating FinFETs and RF devices, including a single gate spanning multiple source/drain pairs, in accordance with one or more aspects of the present invention.
Figure 13:
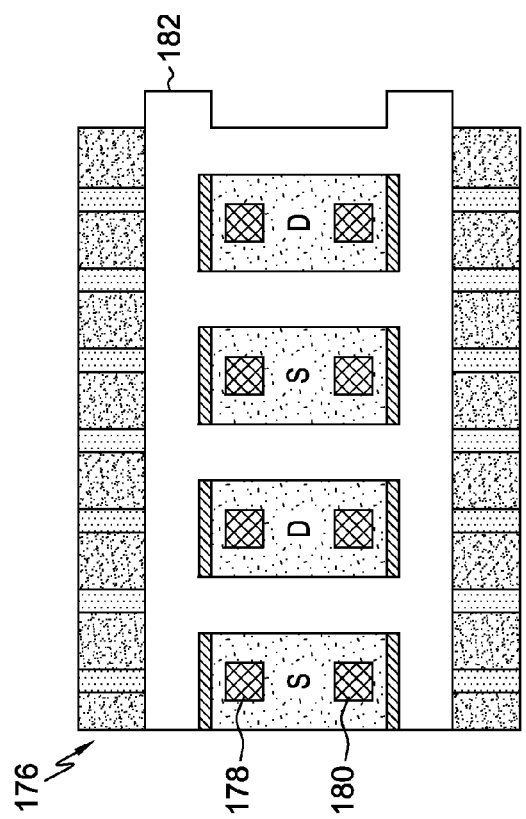
FIG. 13 is a top-down view of one example of a layout design for co-fabricating FinFETs and RF devices, including shared source and drain regions and a gate region limited to the silicon-on-insulator region, in accordance with one or more aspects of the present invention.

FIG. 13 is a top-down view of one example of a layout 176 design for co-fabricated FinFETs and RF devices, including shared source and drain regions (e.g., shared source regions 178 and 180) and a gate region 182 limited to the silicon-on-insulator region, in accordance with one or more aspects of the present invention FIG. 14 is a top-down view of another example of a layout 184 design for co-fabricated FinFETs and RF devices, including a single gate 186 spanning multiple source/drain pairs (e.g., source/drain pair 188).

After the stage of FIG. 6, one or more radio-frequency (RF) semiconductor devices (e.g., RF device 150 in FIG. 9) may be created, for example, using conventional processes and techniques, on the layer 146 of isolation material. The span 118 of isolation material, where it includes an oxide, for example, may also be referred to as a buried oxide layer (BOX), and together with the layer 132 of epitaxial material may be considered local silicon-on-insulator (SOI). Similarly, as shown in FIG. 10, one or more three-dimensional semiconductor devices may be created on the raised structures. For example, a three-dimensional transistor 152 may be created, for example, using conventional processes and techniques, on raised structure 106.

In a first aspect, disclosed above is a method of co-fabricating a radio-frequency semiconductor device with a three-dimensional semiconductor device. The method includes providing a starting three-dimensional semiconductor structure, the starting structure including a bulk semiconductor substrate, raised semiconductor structures coupled to the substrate and surrounded by a layer of isolation material. The method further includes recessing span(s) of the layer of isolation material between adjacent raised structures, creating a layer of epitaxial semiconductor material over the recessed span(s) of isolation material, and creating another layer of isolation material over the layer of epitaxial material.

The method of the first aspect may further include, for example, fabricating planar or three-dimensional (e.g., three-dimensionally FinFET-like) radio-frequency (RF) device(s) on the another layer of isolation material. In one example, the RF device(s) include CMOS (complementary metal oxide semiconductor) RF device(s). Where RF device(s) are fabricated, the method may further include, for example, fabricating three-dimensional semiconductor device(s) on one or more of the raised structures. In one example, fabricating the radio-frequency device(s) may be accomplished while fabricating the three-dimensional semiconductor device(s).

In one example, the starting three-dimensional semiconductor structure provided in the method of the first aspect may further include, for example, a layer of hard mask material over each of the raised semiconductor structures, and the method may further include, for example, planarizing the isolation material using the hard mask material as a stop. Where the method includes planarizing using hard mask material as a stop, the method may further include, for example, after providing the starting structure and before recessing the at least one span, masking the raised structures. In one example, the masking may include, for example, creating a blanket layer of hard mask material, which may be different from that over the raised structures, on a top surface of the planarized isolation material, and removing a portion of the blanket layer of hard mask material above the span(s).

In another example, where the method includes planarizing using hard mask material as a stop, the method may further include, for example, recessing the layer of isolation material and the another layer of isolation material down to between a top surface and a bottom surface of the layer of hard mask material over the raised structures.

In one example, the recessing in the method of the first aspect may include, for example, recessing the span(s) of the layer of isolation material below a top surface of the adjacent raised structures, and exposing a top portion of the adjacent raised structures. Further, creating the layer of epitaxial material in the method of the first aspect may include, for example, growing the epitaxial semiconductor material on the recessed span(s) of the layer of isolation material by seeding with the exposed top portion of the adjacent raised structures.

In a second aspect, disclosed above is a three-dimensional semiconductor structure. The structure includes a semiconductor substrate, raised semiconductor structures coupled to the substrate, a layer of isolation material surrounding the raised structures, region(s) of epitaxial semiconductor material over a recessed span of the layer of isolation material between adjacent raised structures, and another layer of the isolation material over the region(s) of epitaxial semiconductor material.

The structure of the second aspect may include, for example, a radio-frequency (RF) semiconductor device on each of the another layer of isolation material. The RF device(s) may include, for example, planar RF device(s). In another example, the RF device(s) may include three-dimensional RF device(s).

Where the radio-frequency device(s) are present, the structure may further include, for example, three-dimensional semiconductor device(s) on one or more of the raised semiconductor structures.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting three-dimensional semiconductor structure, the starting structure comprising a bulk semiconductor substrate, a plurality of raised semiconductor structures coupled to the substrate and surrounded by a layer of isolation material;
recessing at least one span of the layer of isolation material between adjacent raised structures;
forming a layer of epitaxial semiconductor material over the recessed at least one span of isolation material;
forming another layer of isolation material over the layer of epitaxial material; and
fabricating one or more radio-frequency (RF) devices on the another layer of isolation material.

2. The method of claim 1, wherein the one or more RF devices comprise one or more CMOS (complementary metal oxide semiconductor) RF devices.

3. The method of claim 1, wherein the one or more RF devices comprise one or more planar RF devices.

4. The method of claim 1, wherein the one or more RF devices comprise one or more three-dimensional RF devices.

5. The method of claim 1, further comprising fabricating at least one three-dimensional semiconductor device on one or more of the plurality of raised structures.

6. The method of claim 5, wherein fabricating the one or more radio-frequency devices is accomplished while fabricating the at least one three-dimensional semiconductor device.

7. The method of claim 1, wherein the starting three-dimensional semiconductor structure further comprises a layer of hard mask material over each of the plurality of raised semiconductor structures, the method further comprising planarizing the isolation material using the hard mask material as a stop.

8. The method of claim 7, further comprising, after providing the starting structure and before recessing the at least one span, masking the plurality of raised structures.

9. The method of claim 8, wherein the masking comprises:
creating a blanket layer of hard mask material on a top surface of the planarized isolation material; and
removing a portion of the blanket layer of hard mask material above the at least one span.

10. The method of claim 7, further comprising recessing the layer of isolation material and the another layer of isolation material down to between a top surface and a bottom surface of the layer of hard mask material over the plurality of raised structures.

11. The method of claim 1, wherein the recessing comprises recessing the at least one span of the layer of isolation material below a top surface of the adjacent raised structures, exposing a top portion of the adjacent raised structures, and wherein creating the layer of epitaxial material comprises growing the epitaxial semiconductor material on the recessed at least one span of the layer of isolation material using the exposed top portion of the adjacent raised structures as a seed.

12. A three-dimensional semiconductor structure, comprising:
a semiconductor substrate;
a plurality of raised semiconductor structures coupled to the substrate, a layer of isolation material surrounding the plurality of raised structures;
at least one layer of epitaxial semiconductor material over a recessed span of the layer of isolation material between an upper portion of adjacent raised structures;
another layer of the isolation material over the at least one layer of epitaxial semiconductor material; and
at least one radio-frequency (RF) semiconductor device on the another layer of isolation material.

* * * * *